United States Patent
Liao

(10) Patent No.: US 8,270,222 B2
(45) Date of Patent: Sep. 18, 2012

(54) LOCAL WORD LINE DRIVER OF A MEMORY

(75) Inventor: Chun-Yu Liao, Taichung (TW)

(73) Assignee: Macronix International Co., Ltd.

( * ) Notice: Subject to any disclaimer, the term of this patent is extended or adjusted under 35 U.S.C. 154(b) by 356 days.

(21) Appl. No.: 12/566,154

(22) Filed: Sep. 24, 2009

(65) Prior Publication Data

US 2011/0069558 A1 Mar. 24, 2011

(51) Int. Cl.
*G11C 16/06* (2006.01)

(52) U.S. Cl. ......... 365/185.23; 365/185.03; 365/230.06; 365/185.13; 365/189.16; 365/230.01

(58) Field of Classification Search ............. 365/185.23, 365/230.06, 185.03, 185.13, 189.16, 230.01
See application file for complete search history.

(56) References Cited

U.S. PATENT DOCUMENTS

| | | | |
|---|---|---|---|
| 5,889,711 A | 3/1999 | Yang et al. | |
| 7,170,816 B2 | 1/2007 | Huang et al. | |
| 7,400,536 B1 | 7/2008 | Lin et al. | |
| 7,432,739 B2 | 10/2008 | Chen et al. | |
| 7,527,985 B2 | 5/2009 | Lai et al. | |
| 7,532,513 B2 | 5/2009 | Chen et al. | |
| 2007/0147161 A1 | 6/2007 | Cho et al. | |
| 2008/0181025 A1 | 7/2008 | Ueda | |
| 2008/0205159 A1 | 8/2008 | Liao | |
| 2008/0282120 A1 | 11/2008 | Liao et al. | |
| 2009/0016106 A1* | 1/2009 | Tran et al. | 365/185.05 |
| 2009/0019336 A1 | 1/2009 | Liao et al. | |
| 2009/0034323 A1 | 2/2009 | Lung et al. | |
| 2009/0063918 A1 | 3/2009 | Chen et al. | |
| 2009/0086563 A1 | 4/2009 | Morein | |
| 2009/0116305 A1 | 5/2009 | Son et al. | |
| 2009/0147591 A1 | 6/2009 | Chen et al. | |
| 2009/0323455 A1* | 12/2009 | Yun et al. | 365/230.06 |

* cited by examiner

*Primary Examiner* — Fernando Hidalgo
(74) *Attorney, Agent, or Firm* — Alston & Bird LLP

(57) ABSTRACT

A memory includes a local word line driver for a memory array having a first word line and a second word line. The local word line driver includes a first selection transistor, a second selection transistor, and a middle transistor disposed between the first and second selection transistors. The first word line couples to the first selection transistor and the middle transistor, and the second word line couples to the middle transistor and the second selection transistor.

18 Claims, 20 Drawing Sheets

LOCAL WORD LINE DRIVER OF A MEMORY

TECHNOLOGICAL FIELD

Embodiments of the present invention relate generally to memory devices and, more particularly, relate to a programmable memory array, such as an array including multi-level flash memory cells, having a word line driver with reduced area.

BACKGROUND

Memory devices such as, for example, semiconductor random access memory (RAM) circuits store logic states by applying either high or low voltage levels to memory cell transistors that comprise a memory cell array. As an example, flash memory cells store a charge on a floating gate that may, for example, be doped polysilicon. The stored charge changes a threshold voltage (Vt) of the memory cell. In a "read" operation, a read voltage is applied to the gate of the memory cell, and the corresponding indication of whether the memory cell turns on (e.g., conducts current) indicates the programming state of the memory cell. For example, a memory cell that conducts current during the "read" operation may be assigned a digital value of "1," and a memory cell that does not conduct current during the "read" operation may be assigned a digital value of "0". Charge may be added to and removed from the floating gate to program and erase the memory cell (e.g., to change the memory cell value from "1" to "0").

In order to control the application of voltage to the gate lines of selected cells in a memory cell array, gate line (or word line) voltage control circuits are typically employed. In general, memory cells are accessible by applying activation voltages to word lines and bit lines (drain lines). In this regard, word lines are typically used to activate memory cells and bit lines provide data to or retrieve data from activated memory cells. In a word line voltage control circuit, high and low (or negative) voltage levels may be applied to selected word lines of a memory cell array by a decoder circuit (e.g., a word line driver) in order to activate selected memory cells. In other words, when memory access is desired, an activation voltage may be applied to the corresponding word line by the word line driver to perform the desired function (e.g., read or write). In some cases, when memory access is not needed, the word line driver may apply a deactivation voltage to cease memory access function.

Although the function of word line drivers, as generally described above, is relatively simple, conventional word line drivers have often suffered from various complicating conditions. In this regard, bouncing (e.g., voltage ripples that can occur when a word line is pulled down from an activation voltage) and leakage currents (e.g., resultant from shorting adjacent word lines or word lines and adjacent bit lines) are examples of conditions that can damage memory cells, increase power consumption and/or result in improper operation. To prevent or otherwise mitigate the impacts of such conditions, various designs have been put forth for word line drivers. However, current designs often require relatively large area footprints due to the inclusion of a large number of transistors relative to the number of word lines. In other words, conventional word line drivers often take up a relatively large area and have a relatively high ratio of transistors to word lines.

FIG. 1 illustrates an example showing a conventional word line driver for a single word line (lwl0) in which the word line driver requires three transistors for a 3:1 ratio of transistors to word lines. FIG. 2 illustrates an alternative conventional word line driver for two word lines (lwl0 and lwl1), but for which five transistors (a 5:2 or 2.5:1 ratio) are required. The single word line driver of FIG. 1 is augmented in the example of FIG. 2 in order to support the provision of a word line driver capable of driving two word lines.

Accordingly, it may be desirable to provide an improved word line driver in terms of area consumption.

BRIEF SUMMARY OF EXEMPLARY EMBODIMENTS

Embodiments of the present invention are therefore provided that may enable a reduction in the area of a word line driver. Moreover, some embodiments may provide a word line driver with a 1.5 to 1 ratio of transistors to word lines.

In one exemplary embodiment, a memory is provided that includes a local word line driver for a memory array having a first word line and a second word line. The local word line driver includes a first selection transistor, a second selection transistor, and a middle transistor disposed between the first and second selection transistors. The first word line couples to the first selection transistor and the middle transistor, and the second word line couples to the middle transistor and the second selection transistor.

In another exemplary embodiment, a memory is provided that includes a group of local word line drivers for a memory array having a first word line and a second word line. Each local word line driver of the group includes a first selection transistor, a second selection transistor, and a middle transistor disposed between the first and second selection transistors. The first word line couples to the first selection transistor and the middle transistor, and the second word line couples to the middle transistor and the second selection transistor.

In another exemplary embodiment, a memory including a group word line decoder and a plurality of groups of local word line drivers for a memory array having a first word line and a second word line of a plurality of local word lines is provided. Each local word line driver of each group includes a first selection transistor, a second selection transistor, and a middle transistor disposed between the first and second selection transistors. The group word line decoder is configured to provide selection of one of the groups. A first word line couples to the first selection transistor and the middle transistor, and the second word line couples to the middle transistor and the second selection transistor.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

Figure 7A:
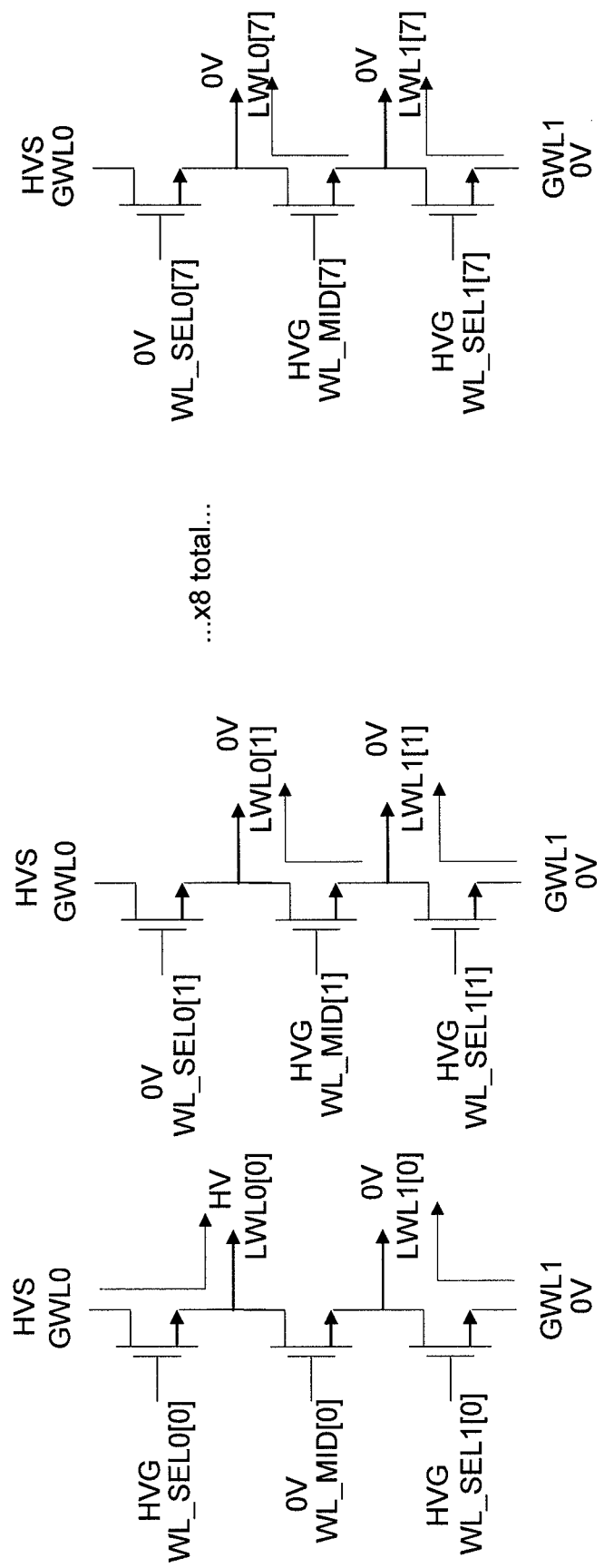
Figure 7B:
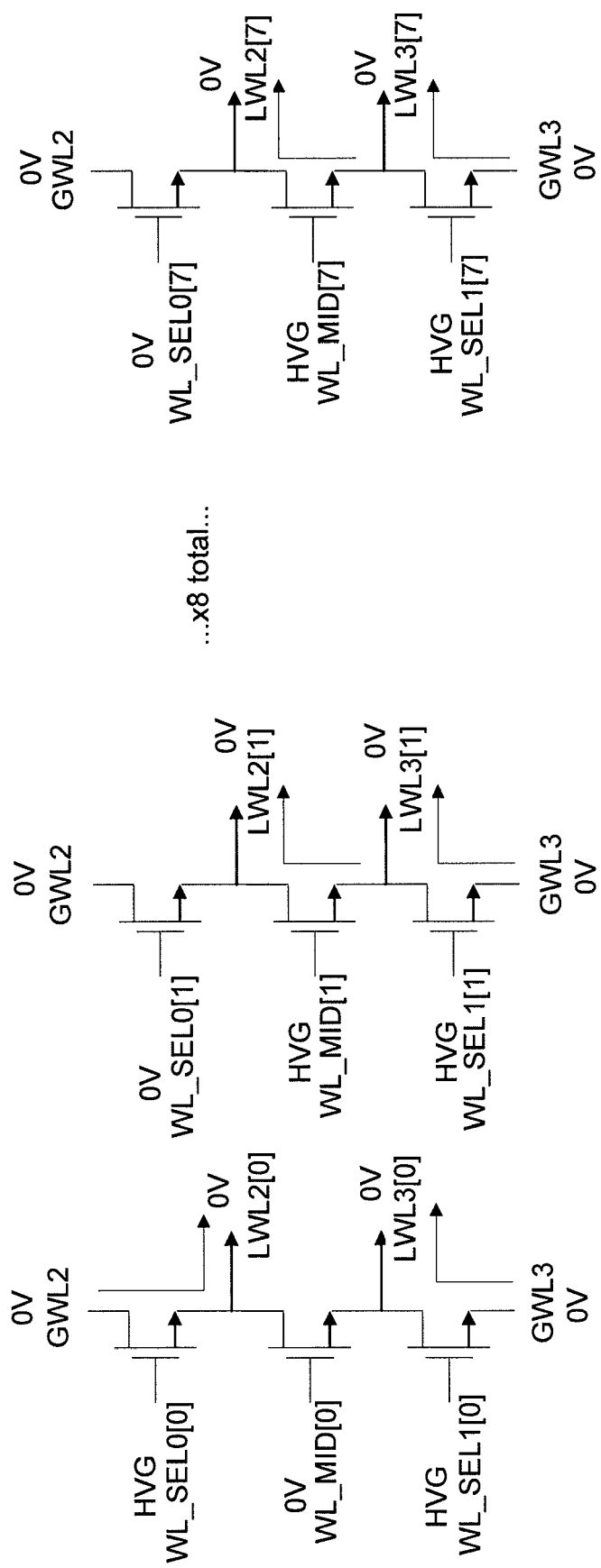
Figure 7C:
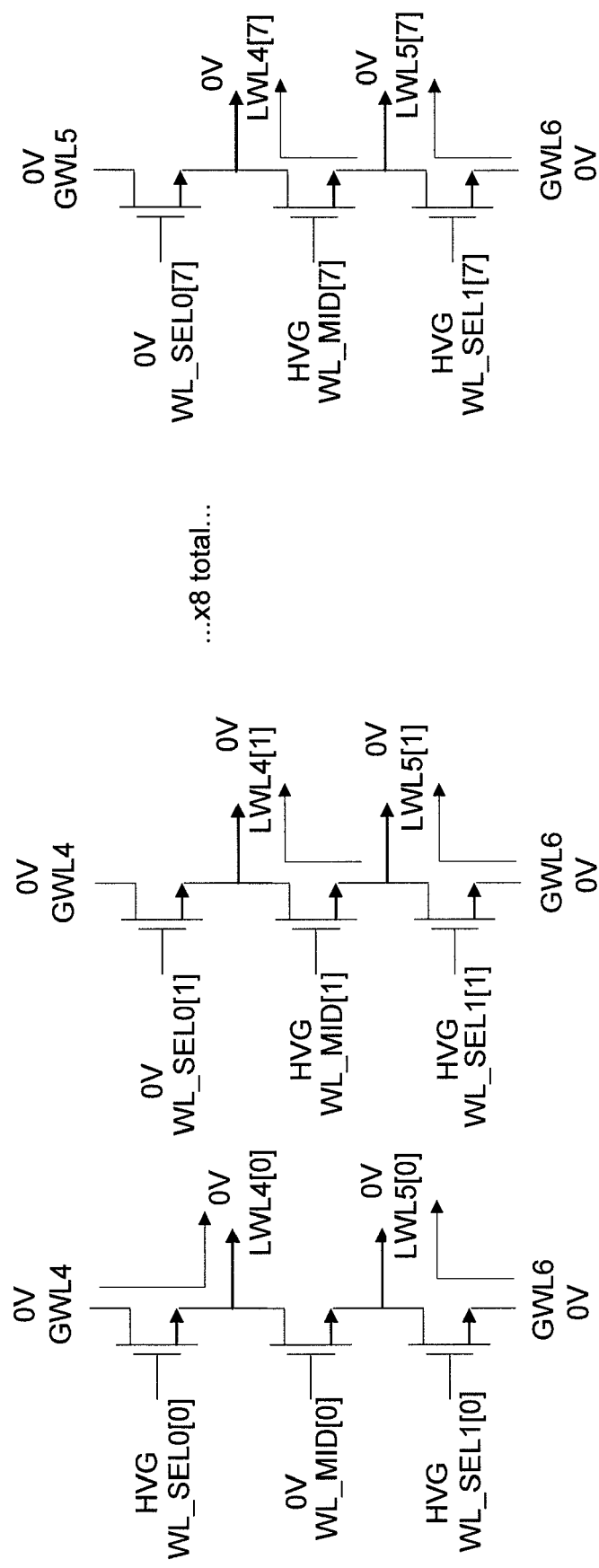
Figure 8A:
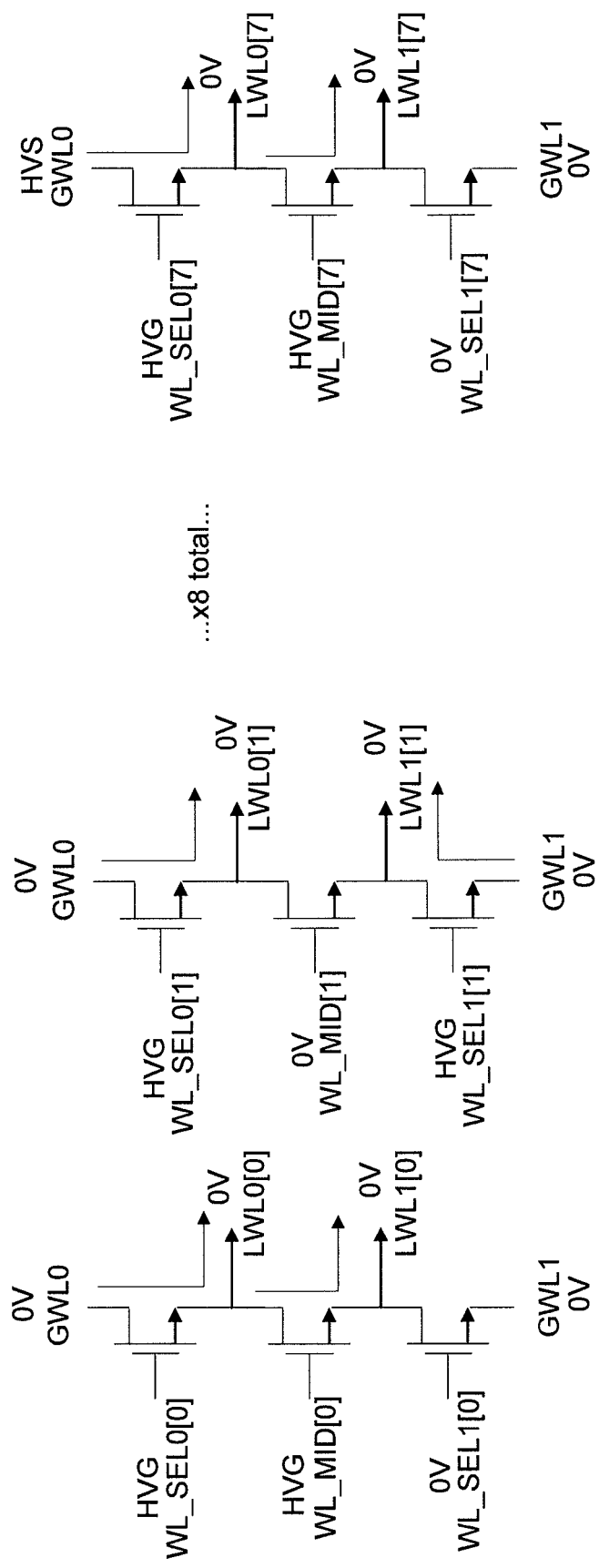
Figure 8B:
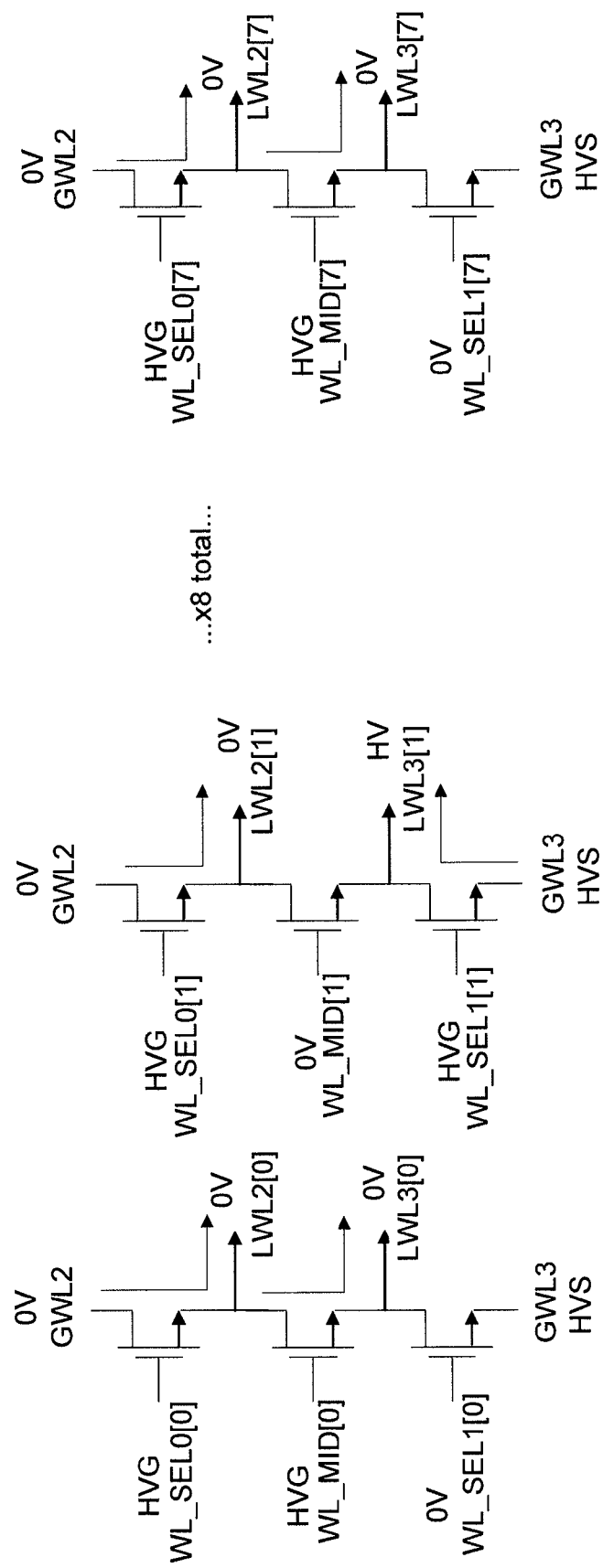
Figure 8C:
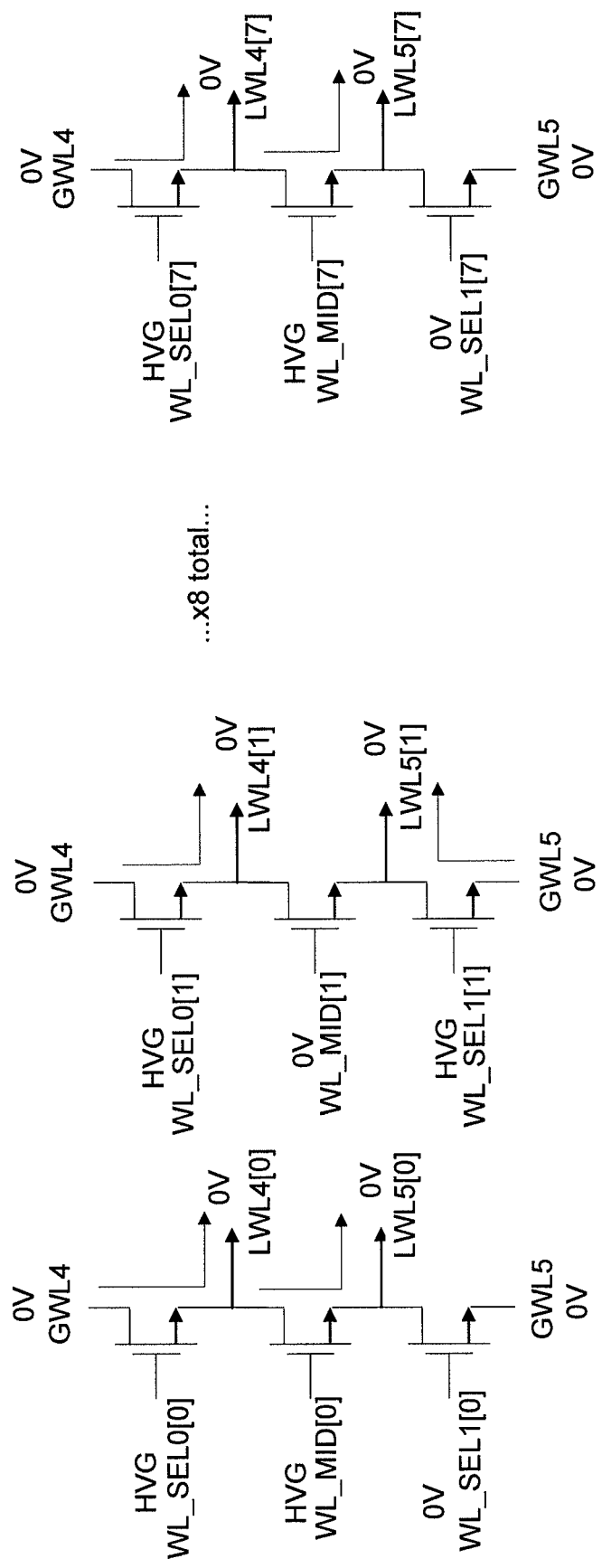
Figure 9A:
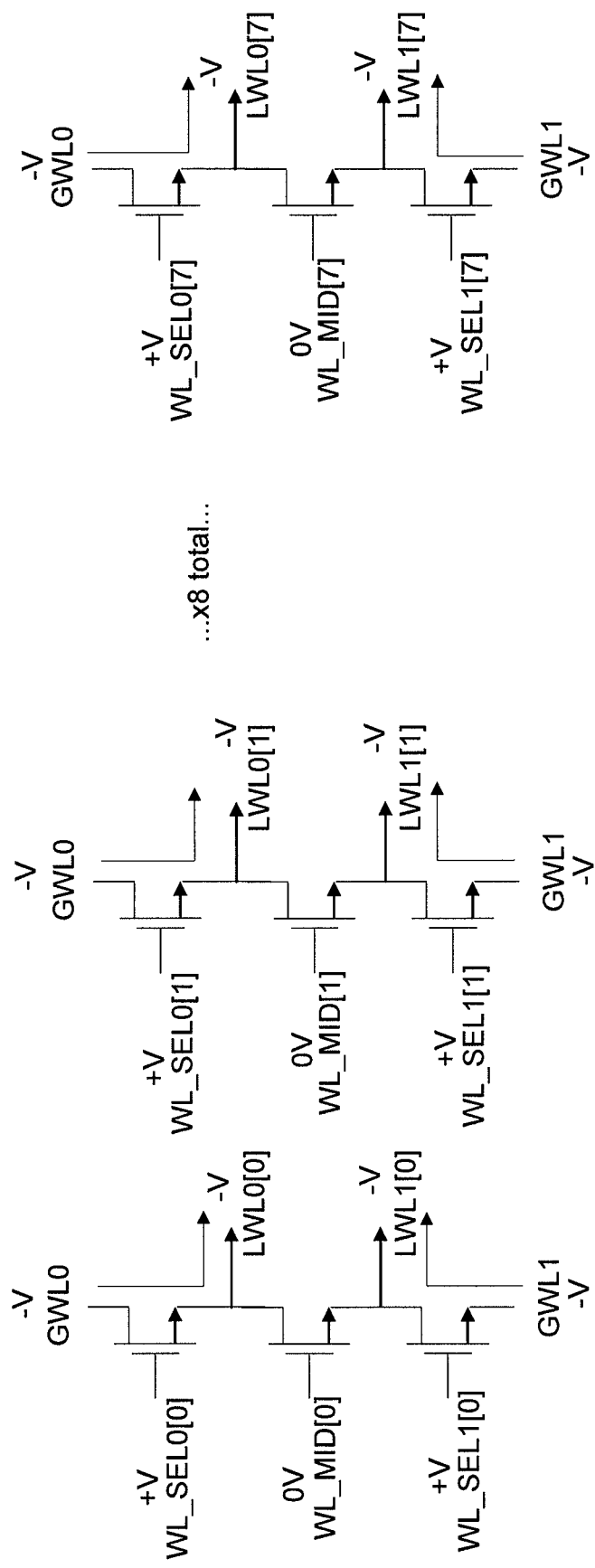
Figure 9B:
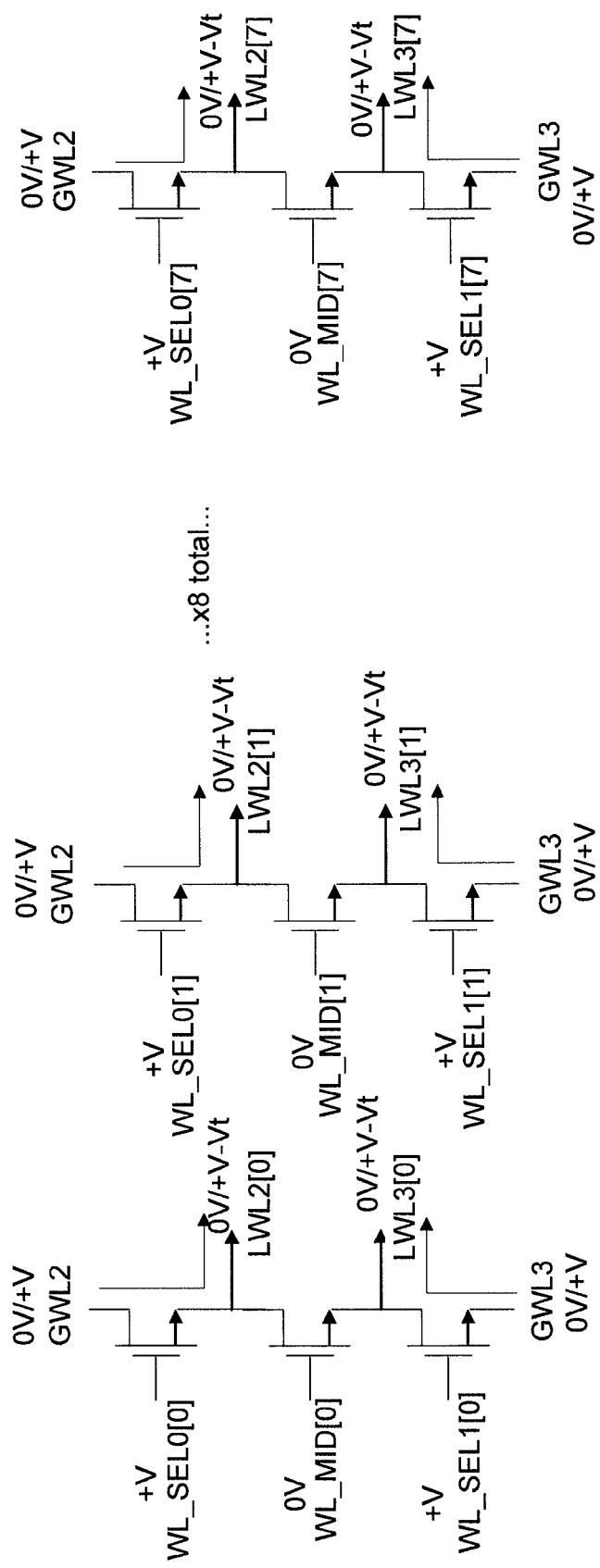
Figure 10A:
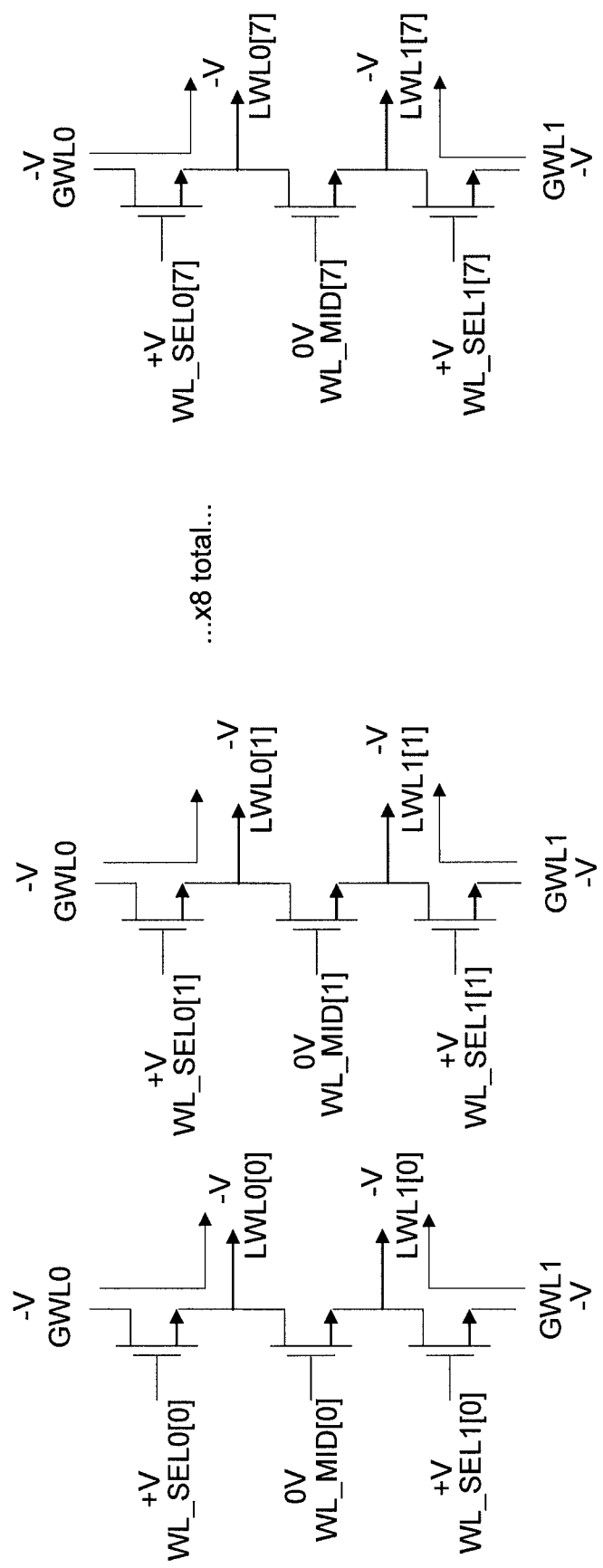
Figure 10B:
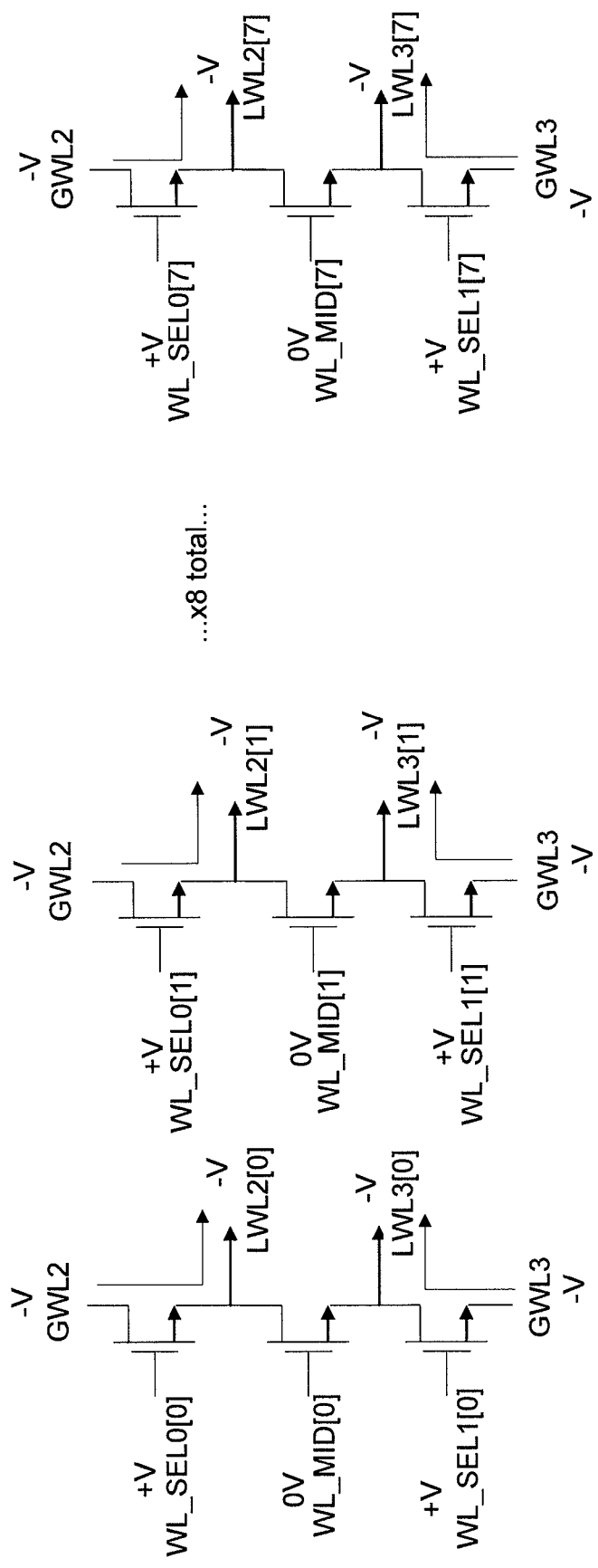
Figure 11:
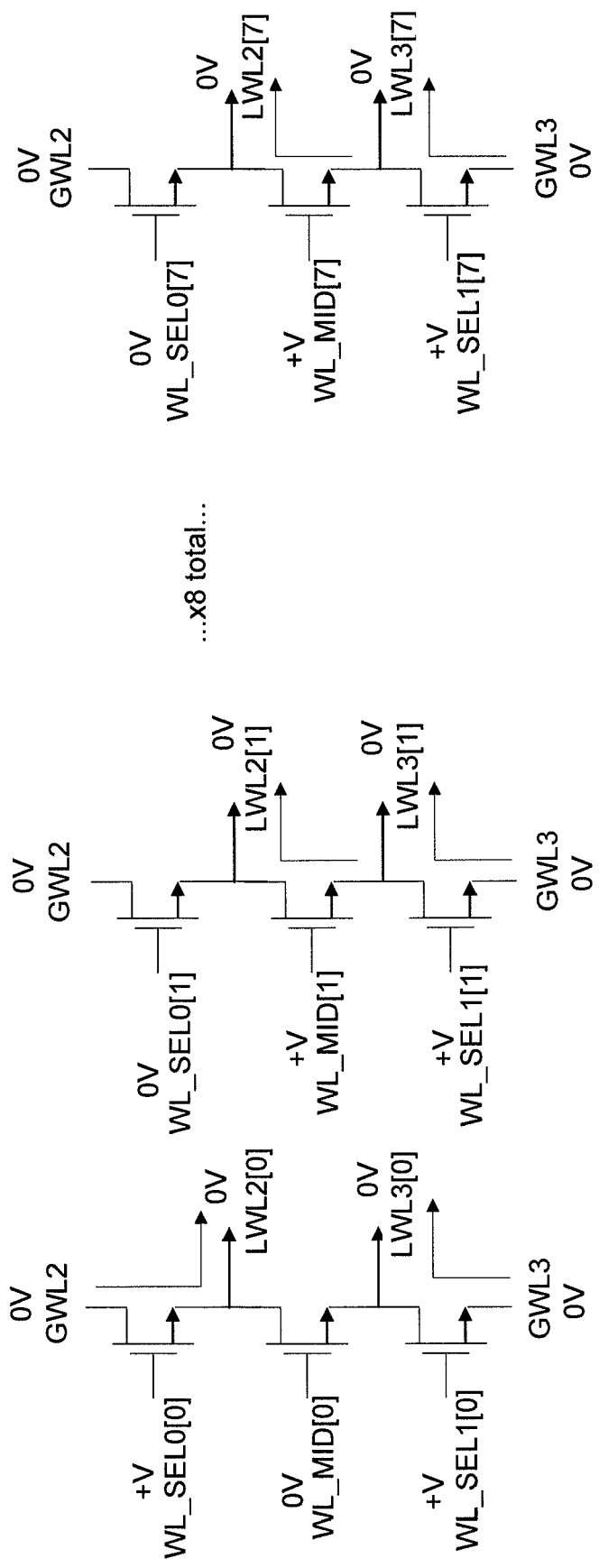
Figure 12:
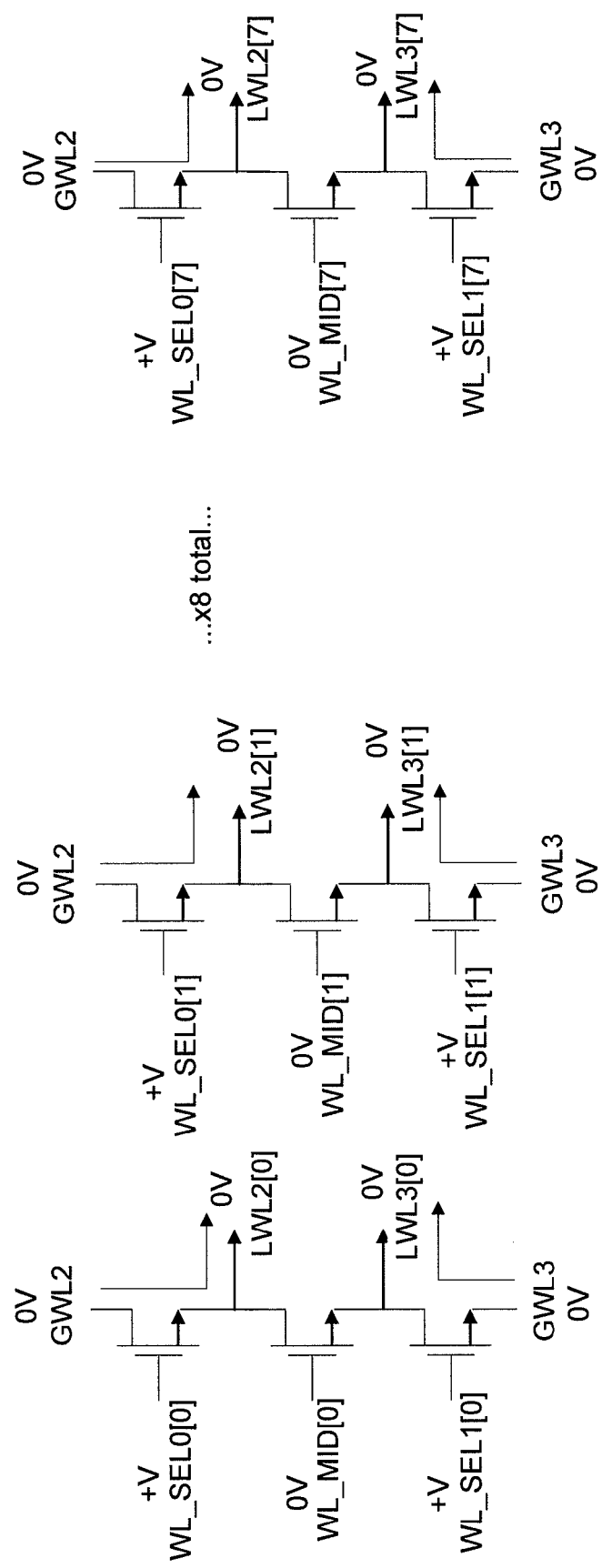
Figure 13A:
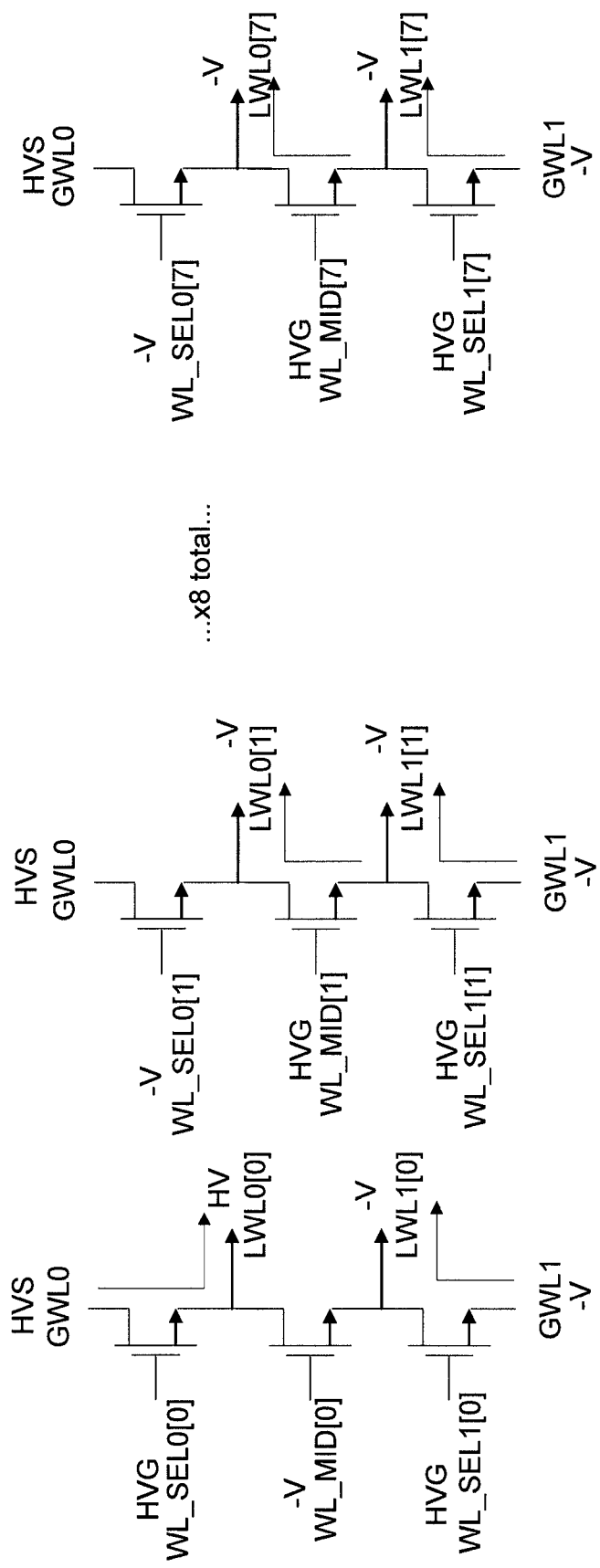
Figure 13B:
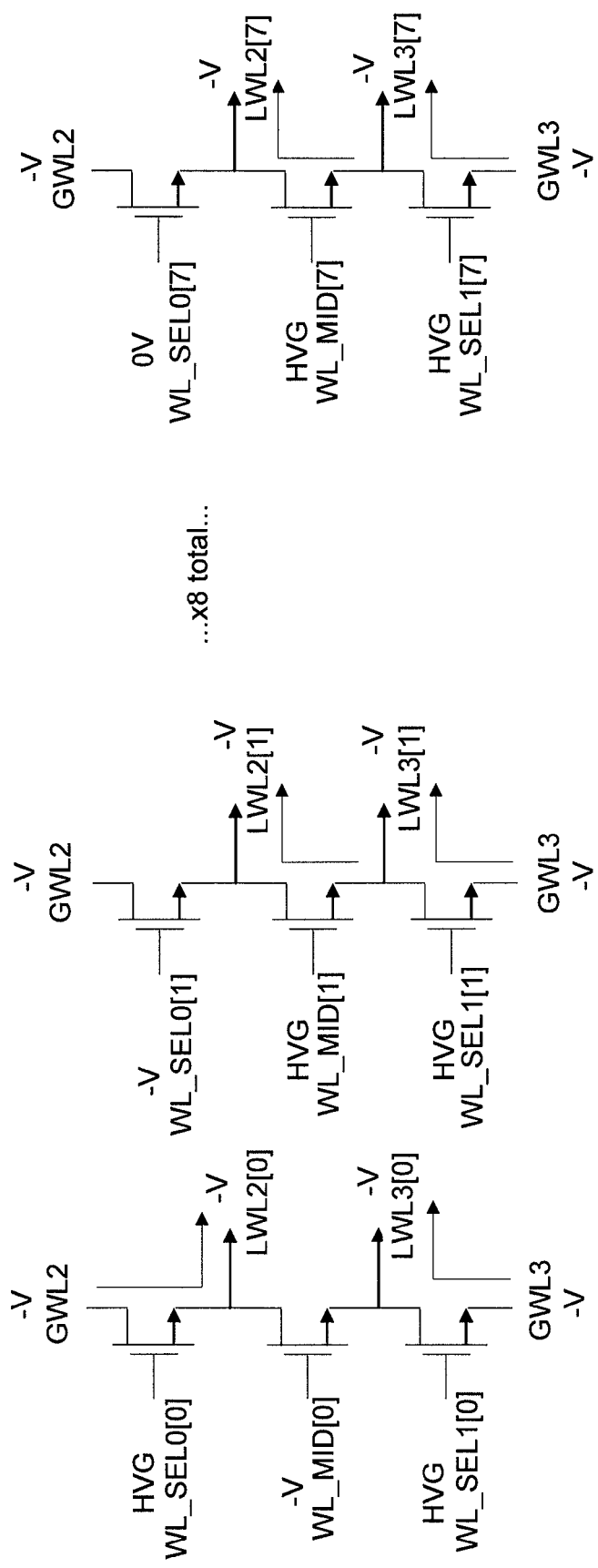
Figure 13C:
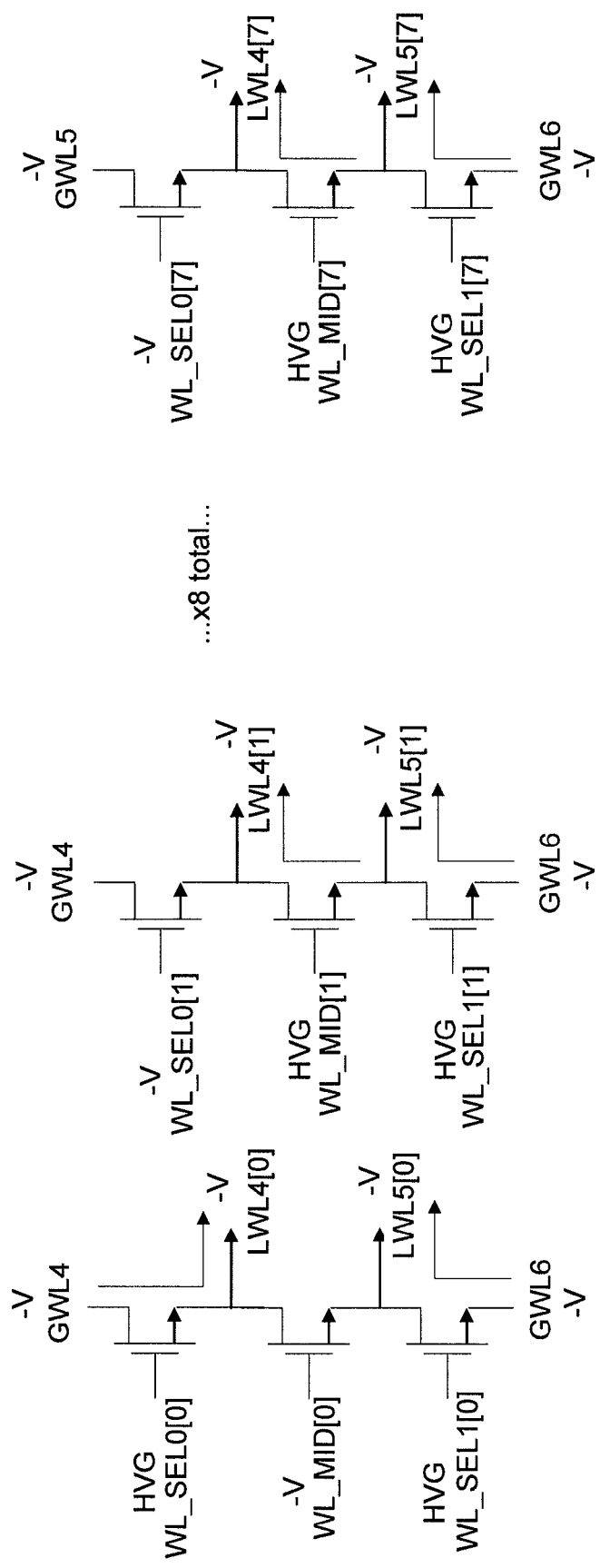

FIG. 7, which includes FIGS. 7A, 7B and 7C, illustrates an example in which a single word line is selected for either program or read operation and other word lines have deselected output values according to an exemplary embodiment of the present invention;

FIG. 8, which includes FIGS. 8A, 8B and 8C, illustrates an alternative example in which a different word line is selected according to an exemplary embodiment of the present invention;

FIG. 9, which includes FIGS. 9A and 9B, illustrates another alternative example in which negative voltage operation is provided to illustrate flexibility of implementation options provided by examples of embodiments of the present invention;

FIG. 10, which includes FIGS. 10A and 10B, illustrates an example for providing an erase operation to memory cells of all word lines according to an exemplary embodiment of the present invention;

FIG. 11 illustrates an example in which all word lines are deselected for a particular local word line driver according to an exemplary embodiment of the present invention;

FIG. 12 shows an alternate decode method for de-selection of all word lines according to an exemplary embodiment of the present invention; and FIG. 13, which includes FIGS. 13A, 13B and 13C, illustrates an example for providing selection of a particular local word line with de-selection of all other word lines being indicated by a negative voltage according to an exemplary embodiment of the present invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

Some embodiments of the present invention may provide a mechanism by which improvements may be experienced in relation to the area taken up by a word line driver. In this regard, some embodiments of the present invention provide a reduced ratio of transistors to word lines to 1.5:1.

Figure 1:
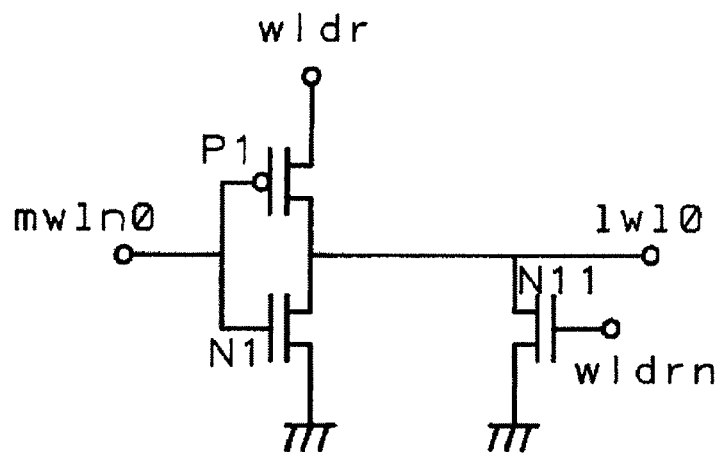
FIG. 1 illustrates an example of a conventional word line driver for a single word line.
Figure 2:
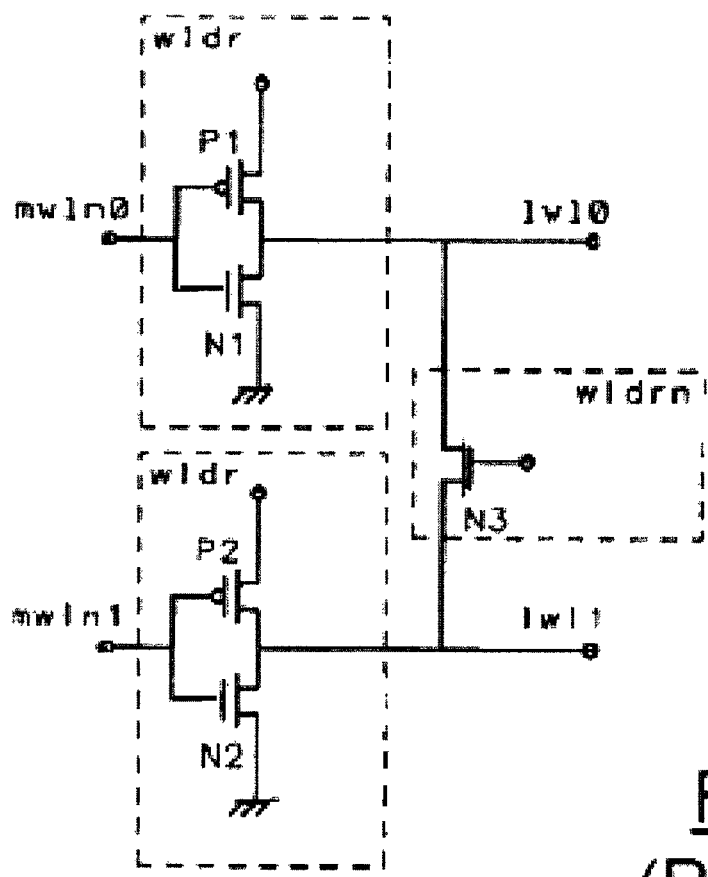
FIG. 2 illustrates an example of a conventional word line driver for two word lines.
Figure 3:
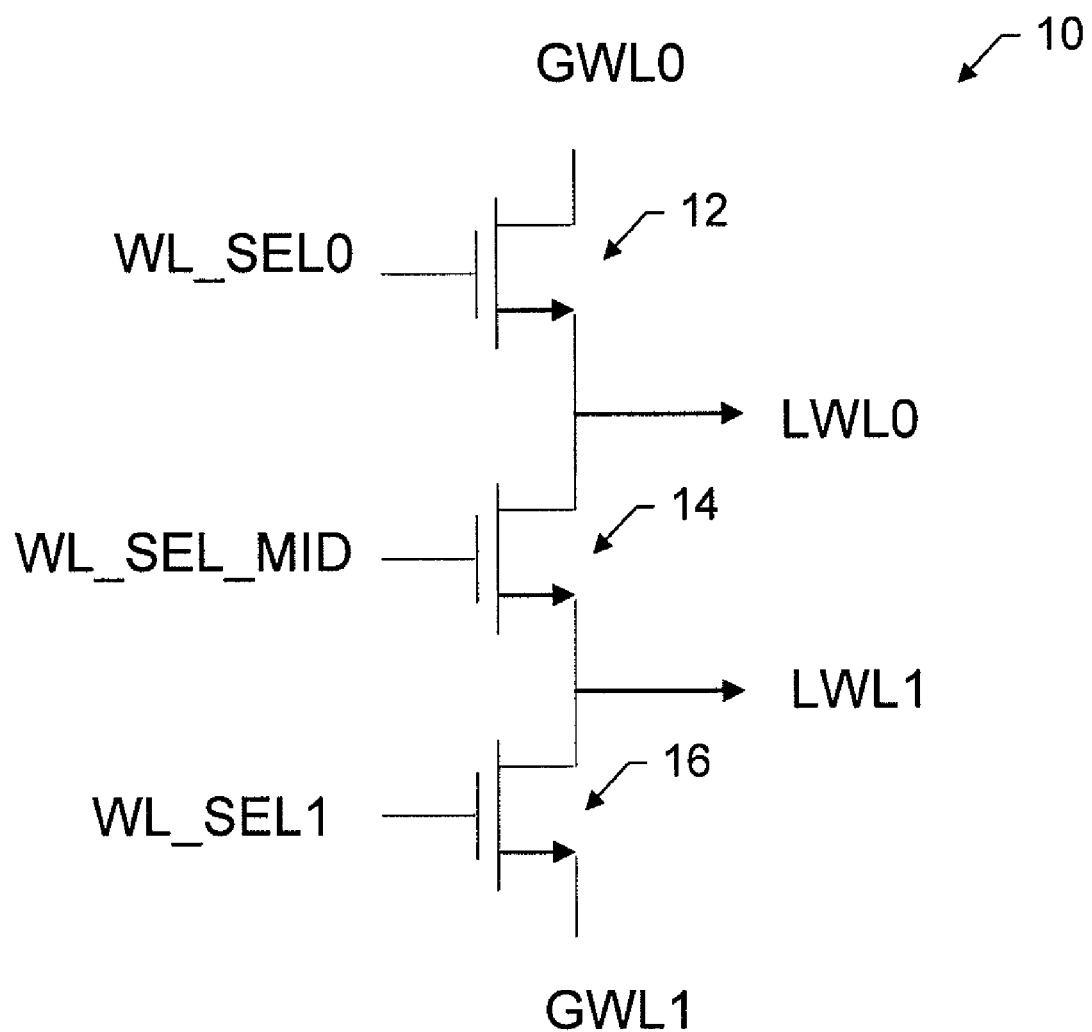
FIG. 3 illustrates a local word line driver according to an exemplary embodiment of the present invention.

FIG. 3 shows a word line driver according to an exemplary embodiment of the present invention. As shown in FIG. 3, a local word line driver (LWL driver) 10 is provided including a first transistor 12, a second transistor 14 and a third transistor 16 (e.g., three n-channel metal oxide semiconductor (NMOS) field effect transistors) for driving two word lines (LWL0 and LWL1). Thus, the embodiment of FIG. 3 provides a 1.5 NMOS transistor word line driver (having a ratio of 1.5 transistors per word line) in order to reduce the area of the local word line driver 10. Each transistor may include a first terminal (e.g., either a drain or source terminal) and a second terminal (e.g., either a source or drain dependent upon the configuration of the first terminal) and a gate terminal. The transistors of the local word line driver 10 may be arranged such that a second terminal of a preceding transistor is connected to a first terminal of a subsequent transistor. Voltage sources with selectable voltage levels may be provided at each end of a chain of the three transistors (e.g., GWL0 and GWL1, which may be defined as word line driver group selection values). For example, the first terminal of the first transistor 12 may be connected to GWL0, and the second terminal of the first transistor 12 may be connected to the first terminal of the second transistor 14. The second terminal of the second transistor 14 may then be connected to the first terminal of the third transistor 16 and the second terminal of the third transistor 16 may be connected to GWL1. Values of GWL0 and GWL1 may be respective different ones of a positive voltage source, a negative voltage source or a ground voltage (e.g., 0V). In some embodiments, the first transistor 12 may be referred to as a first selection transistor, the second transistor 14 may be referred to as a middle transistor and the third transistor 16 may be referred to as a second selection transistor.

The gates of the transistors of the local word line driver 10 may each be configured to receive an input signal used to select a corresponding one of the word lines (LWL0 or LWL1). In an exemplary embodiment, the gate of the first transistor 12 may be configured to receive a first word line selection input (WL_SEL0), and the gate of the third transistor 16 may be configured to receive a second word line selection input (WL_SEL1). The gate of the second transistor 14 may be configured to receive a selection middle input (WL_SEL_MID).

Figure 4:
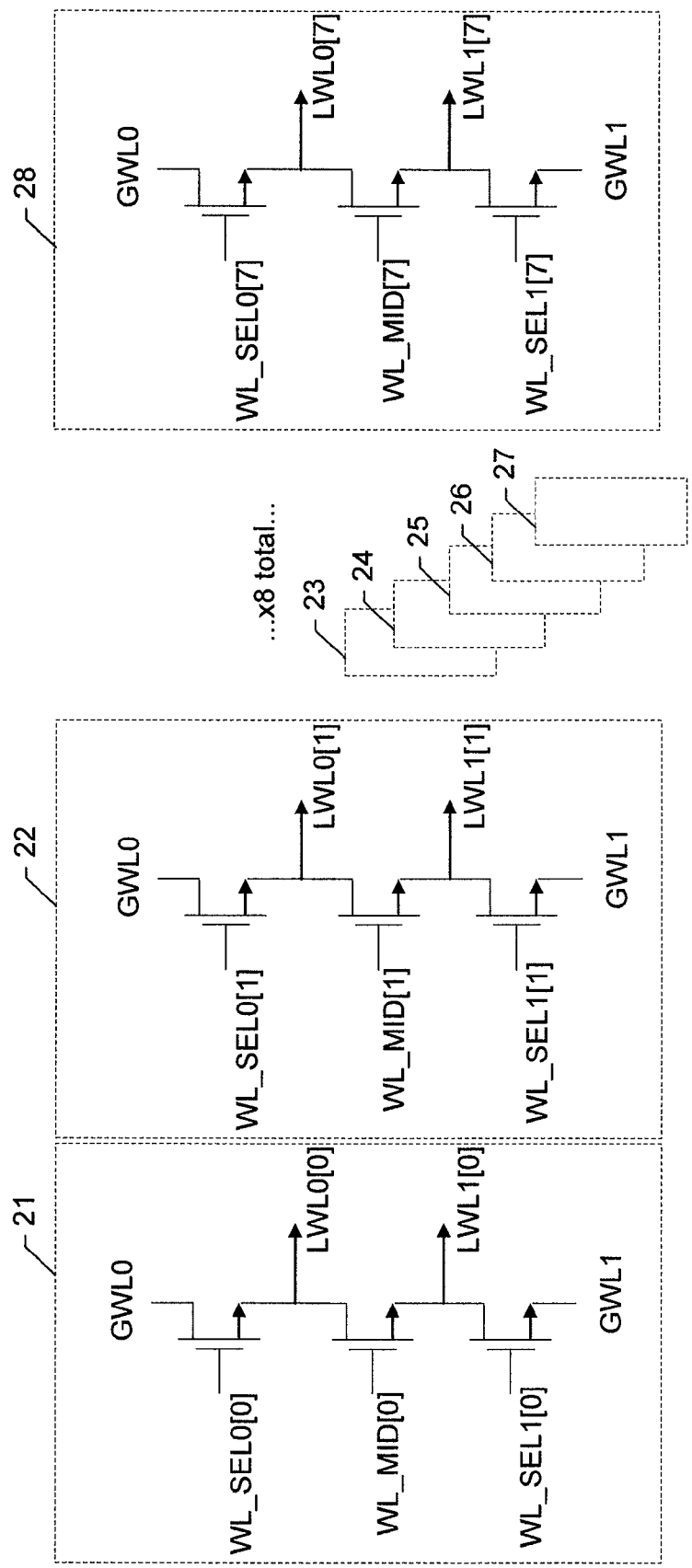
FIG. 4 illustrates a diagram of the local word line driver of FIG. 3 scaled to drive sixteen word lines according to an exemplary embodiment.

Although the local word line driver 10 of FIG. 3 can be used for two word lines, example embodiments of the present invention are also scalable to service of virtually any number of word lines. As an example, eight local word line drivers such as the one shown in FIG. 3 could be utilized for selection of sixteen word lines. FIG. 4 illustrates an example of a word line driver configured to enable selection with respect to sixteen word lines. In this regard, a word line driver for sixteen lines (LWL_16) may include a first LWL driver 21, a second LWL driver 22, five additional local word line drivers similar to the first and second LWL drivers 21 and 22 corresponding to third through seventh LWL drivers (not shown in detail, but represented by LWL drivers 23-27), and an eighth LWL driver 28. Since each LWL driver includes two word lines (e.g., the first LWL driver 21 includes LWL0[0] and LWL1[0], the second LWL driver 22 includes LWL0[1] and LWL1[1], ..., and the eight LWL driver 28 includes LWL0[7] and LWL1[7]) and there are a total of eight LWL drivers, the total number of word lines provided is sixteen. In the example of FIG. 4, the first LWL driver 21 and the other LWL drivers up to and including the eight LWL driver 28 define a word line driver group including sixteen word lines (e.g., LWL_16).

Figure 5:
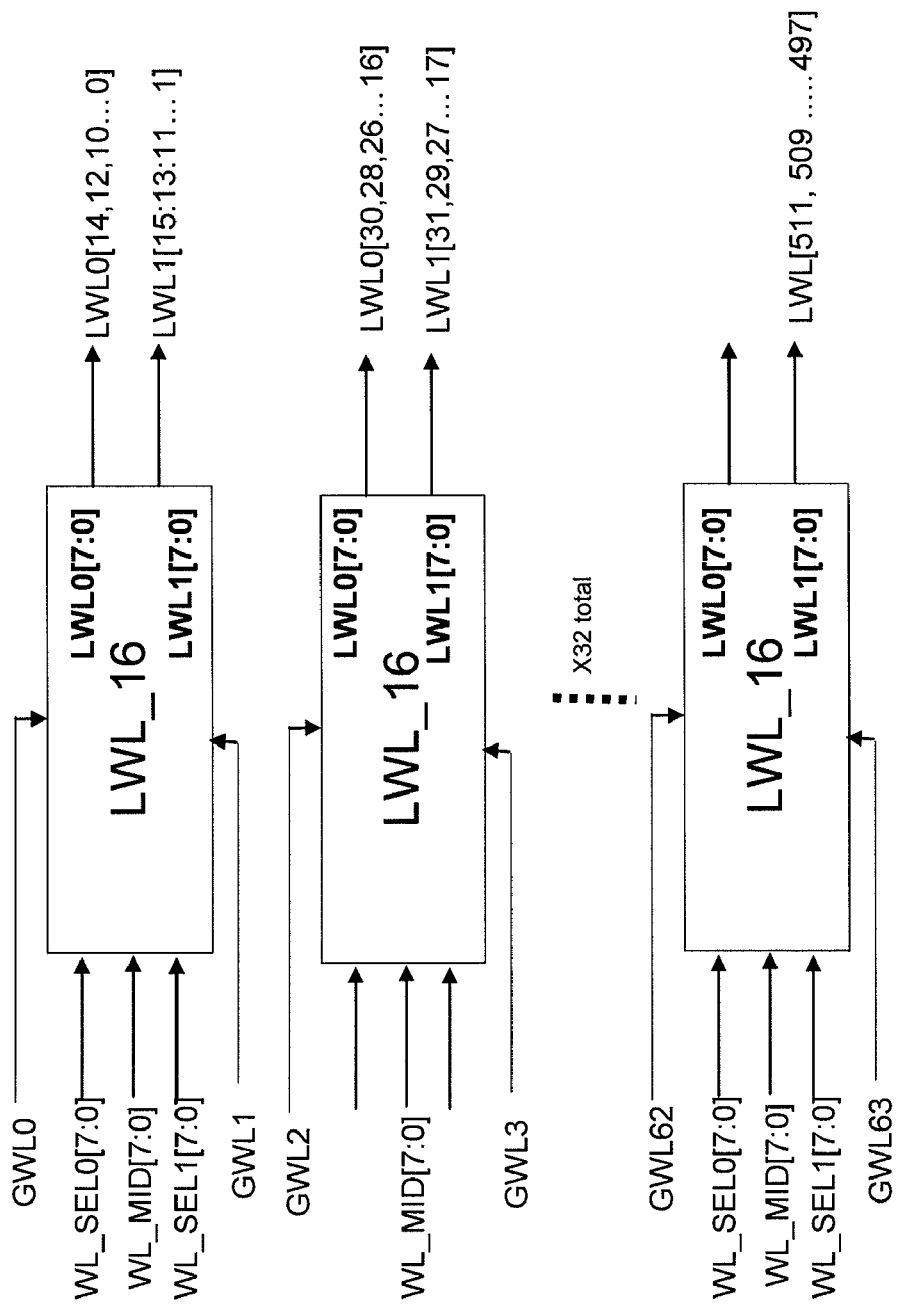
FIG. 5 illustrates an example of the scalability of a word line driver for up to 512 word lines according to an exemplary embodiment of the present invention.

In some cases, one or more units that each provide a particular number of LWL drivers (or groups of LWL drivers) may be provided in a scalable manner to provide for word line selection among a relatively large number of word lines. For example, FIG. 5 illustrates a word line driver for up to 512 word lines, where 32 individual LWL_16s may be provided. In the example of FIG. 5, each individual LWL_16 may be provided with its own respective GWL values to enable selection of a particular one of the LWL_16s based on the GWL values provided. As shown in the example of FIG. 5, GWL0 and GWL1 are provided to represent the GWL values for the first LWL_16 which provides the sixteen word lines LWL0 [14, 12, 10, ..., 0] and LWL1[15, 13, 11, ..., 1], GWL2 and GWL3 represent the GWL values for the second LWL_16 which provides the sixteen word lines LWL0[30, 28, 26, ..., 16] and LWL1[31, 29, 27, ..., 17], corresponding GWLs for third to thirty-first LWL_16s (not shown), and GWL62 and GWL63 represent the GWL values for the thirty-second LWL_16 which provides the sixteen word lines LWL0[510,

508, 506, . . . , 496] and LWL1[511, 509, 507, . . . , 497]. As shown in FIG. 5, the gate lines of the transistors of each of the LWL drivers may share selection inputs. In other words, the selection inputs for the first LWL_16 (i.e., WL_SEL0[7:0], WL_MID[7:0] and WL_SEL1[7:0]) may be shared with each other LWL_16. Accordingly, individual word lines may be selected based on the GWL values as shown in FIG. 6.

Figure 6:
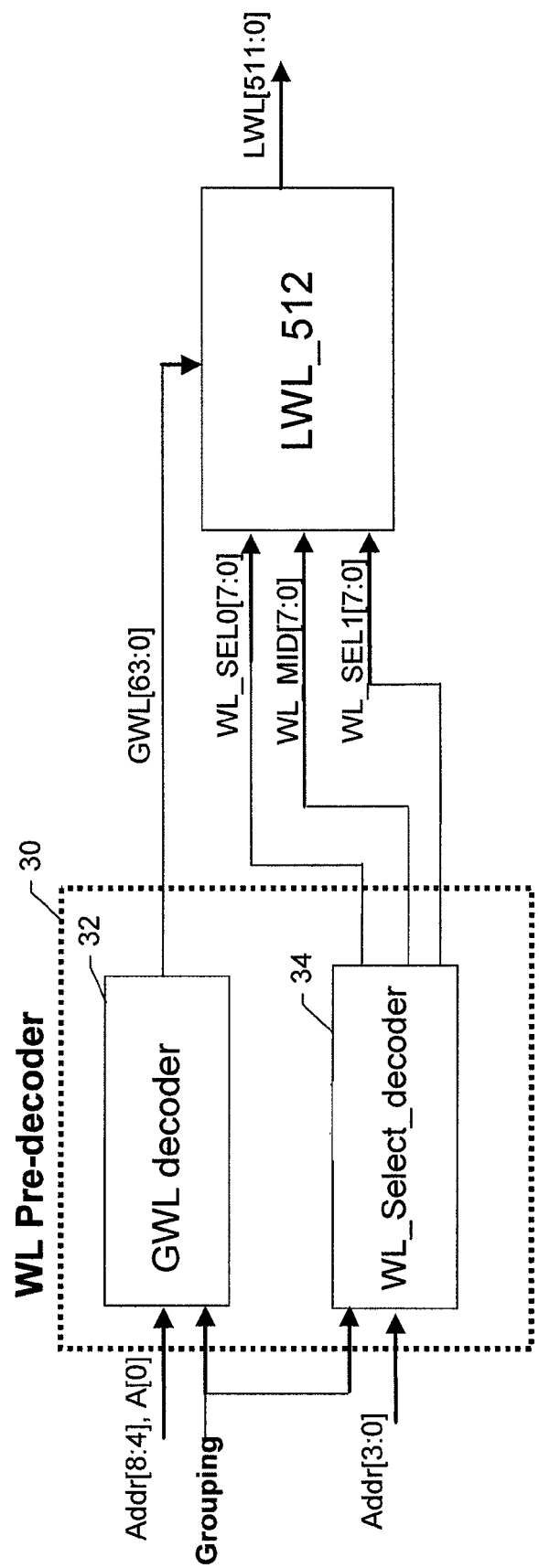
FIG. 6 illustrates a word line driver for up to 512 word lines and including a word line pre-decoder provided to enable selection of desired word lines among the 512 word lines according to an exemplary embodiment of the present invention.

FIG. 6 illustrates a word line driver (LWL_512) for up to 512 word lines, where a word line pre-decoder (WL pre-decoder 30) may be provided to enable selection of desired word lines among the 512 word lines of the LWL_512. In an exemplary embodiment, the WL pre-decoder 30 may include a GWL decoder 32 configured to receive address and/or grouping information to enable identification of the GWL value to be output to the LWL_512. However, once selected by the GWL decoder 32, a group of LWL drivers (e.g., a selected LWL_16) may provide selection of a particular word line for activation based on word lines selection inputs provided thereto by a WL_select_decoder 34.

Thus, the WL pre-decoder 30 may also include the WL_select_decoder 34 configured to receive address and/or grouping information to enable identification of word line selection values (i.e., via a selected code provided to WL_SEL0[7:0], WL_MID[7:0] and WL_SEL1[7:0]) to be provided to the LWL_512 to identify a selected word line to be activated. Based on the word line selection values and the GWL values provided to the LWL_512, selection of desired word lines may be provided. Thus, for example, an address may be output to GWL[63:0] to provide that a corresponding desired one of the LWL_16s is selected, and thus the identified word line to be activated based on the word line selection values provided will be activated for the selected one of the LWL_16s. Of note, although the examples above describe employment in a LWL_512, it should be appreciated that alternative embodiments are scalable to LWLs and decoding systems for use with smaller or larger scales. Thus, for example, embodiments with 1024 or 2048 word lines may also be supported as well as multi-sector common decoders.

In general terms, a coded word line selection input may be provided based on the address (or addresses) to be written to, read or erased. The coded word line selection input may be generated based on the address to be written to in order to ensure that the corresponding word line within a particular LWL_16 is activated. In general, the word line selection input may otherwise enable each corresponding same word line in all LWL_16s if the GWL values permitted activation. Thus, the address to be written to, read or erased not only forms the basis for the coded word line selection inputs generated by the WL_select_decoder 34, but also forms the basis for the GWL values provided by the GWL decoder 32. The GWL decoder 32 provides GWL values to ensure de-selection of all word lines of LWL_16s that do not include the word line to be activated. The GWL decoder 32 provides GWL values to the LWL_16 that includes the word line to be activated that enable activation of the word line to be activated. Thus, WL pre-decoder 30 uses the address to be written to, read or erased to generate coded values that activate the word line that corresponds to the address.

FIG. 7, which includes FIGS. 7A, 7B and 7C, illustrates an example in which a single word line is selected (e.g., as indicated by the output value HV (e.g., 8V or 5V)) for either program or read operation, and other word lines have deselected output values of 0V. In the example of FIG. 7, HVS represents the value of GWL0 and the value of GWL1 is 0V. HVG represents an input voltage value (e.g., 9V) applied to word line selection lines as an alternative to 0V. FIG. 7A illustrates the first LWL_16, and FIGS. 7B and 7C represent the second and third LWL_16s, respectively. Other LWL_16s, although includable to whatever scale is desired (e.g., LWL_512, LWL_1024, LWL_2048), are not shown since the example shown can be fully explained with three LWL_16s.

In order to select LWL0[0] (i.e., the first LWL of the first LWL_16), the same word line selection values may be provided to the word selection lines of each LWL_16 by the WL_select_decoder 34. In this regard, the first LWL driver of each LWL_16 may have HVG applied to the WL_SEL0[0], 0V applied to the WL_MID[0] and HVG applied to the WL_SEL1[0]. Every other LWL driver (i.e., LWL drivers two through eight) may have 0V applied to their respective WL_SEL0 lines (e.g., WL_SEL0[1], WL_SEL0[2], . . . , WL_SEL0[7]) and HVG applied to their respective WL_MID lines (e.g., WL_MID[1], WL_MID[2], . . . , WL_MID[7]) and WL_SEL1 lines (e.g., WL_SEL1[1], WL_SEL1[2], . . . , WL_SEL1[7]). However, the GWL decoder 32 may only provide HVS for GWL0 and all other GWL values (e.g., GWL1, GWL2, GWL3, GWL 4, GWL5, . . . ) may be 0V. The results of these selection values being applied are shown in FIGS. 7A to 7C.

As shown in FIG. 7A, by setting WL_SEL0[0] to HVG, the first transistor of the first LWL driver in FIG. 7A is gated and HV is output to LWL0[0]. HV may be clamped by HVG or HVS. Due to the application of 0V on WL_MID[0] and HVG on WL_SEL1[0], the second transistor of the first LWL driver is not gated and the third transistor is gated placing 0V on LWL1[0]. For the second through eighth LWL drivers of FIG. 7A, the presence of 0V on WL_SEL0[1] to WL_SEL0[7] leaves each respective first transistor not gated, while HVG on WL_MID[1] to WL_MID[7] and WL_SEL1[1] to WL_SEL 1 [7] gate all respective transistors to pull all corresponding word lines (LWL0[1] to LWL0[7] and LWL1[1] to LWL1[7] down to 0V.

Due to the application of 0V for GWL2, GWL3, GWL4, GLW5, . . . , by the GWL decoder 32, each other LWL_16 provides a 0V output on all corresponding word lines as shown in FIGS. 7B and 7C, even though the WL_select_decoder 34 provides the same word line selection inputs to each LWL_16.

FIG. 8, which includes FIGS. 8A, 8B and 8C, illustrates an alternative example in which a different word line is selected. As shown, LWL3[1] is selected in FIG. 8B by applying 0V to all GWLs except GWL3, providing HV to all WL_SEL0[7:0] selection lines, and applying HV to WL_SEL1[1] and WL_MID[7,6,5,4,3,2,0], while applying 0V to WL_SEL1[7,6,5,4,3,2,0] and WL_MID[1]. As shown in FIGS. 8A and 8C, all other LWL_16s other than the LWL_16 of FIG. 8B will provide 0V on their corresponding word lines even though they share the same word line selection inputs as the LWL_16 of FIG. 8B. Meanwhile, the LWL_16 of FIG. 8B provides 0V for the non-selected word line LWL2[1] and HV as an output on the selected word line LWL3[1]. Accordingly, in the example of FIG. 8 as well, the WL_select_decoder 34 provides the same word line selection inputs to each LWL_16, but the GWL decoder 32 only provides a GWL value to select the corresponding LWL_16 to provide the selection of the desired word line.

FIG. 9, which includes FIGS. 9A and 9B, illustrates another alternative example in which negative voltage operation is provided to further illustrate the flexibility of implementation options provided by examples of embodiments of the present invention. FIG. 9 shows negative voltage group decoding for an erase operation. In the example of FIG. 9, LWL0[7:0] and LWL1[7:0] are provided with a −V(negative voltage) output for providing an erase operation to memory cells of the corresponding word lines (see FIG. 9A). Meanwhile, all other word lines produce either 0V or +V−Vt (positive voltage minus a threshold voltage) as an output to prevent erasing operations with respect to the corresponding word lines (see FIG. 9B as an example applicable to all other LWL_16s. In the operation of the example of FIG. 9, the WL_select_decoder 34 provides the same word line selection inputs to each LWL_16, namely +V(positive voltage) to each WL_SEL0[7:0] and WL_SEL1[7:0], while providing 0V to each WL_MID[7:0]. These word line selection inputs provide for the GWL value of each LWL_16 to be passed through as the word line output value. Since all other LWL_16s have GWL of 0V or +V (positive voltage) provided by the GWL decoder 32 and the first LWL_16 has −V (negative voltage) provided for GWL0 and GWL1, the output of word lines LWL0[7:0] and LWL1 [7:0] is −V (negative voltage) for providing the erase operation and all other word lines produce either 0V or +V−Vt (positive voltage minus threshold voltage).

FIG. 10, which includes FIGS. 10A and 10B, illustrates an example for providing an erase operation to memory cells of all word lines. Similar to the example of FIG. 9, the WL_Select_decoder 34 provides the same word line selection inputs to each LWL_16, namely +V (positive voltage) to each WL_SEL0[7:0] and WL_SEL1[7:0], while providing 0V to each WL_MID[7:0]. However, the GWL decoder 32 provides −V (negative voltage) for all GWL values thereby enabling −V (negative voltage) to be provided as the output of every word line (e.g., LWL0[7:0] to LWL3[7:0], and all other LWLs of any additional LWL_16s that may be provided.

FIG. 11 illustrates an example in which all word lines are deselected for a particular LWL_16 (e.g., the second LWL_16 of the example LWL_512 described in connection with FIG. 7). In this regard, the WL_select_decoder 34 provides +V (positive voltage) to the WL_SEL0[0], WL_MID [7,6,5,4,3,2,1] and WL_SEL1[7:0], and provides 0V to the WL_ SEL0[7,6,5,4,3,2,1] and WL_ MID[0] in order to provide deselected 0V outputs to each word line in response to GWL2 and GWL3 having 0V applied thereto. FIG. 12 shows an alternate decode method for de-selection of all word lines. In the example of FIG. 12, again the GWL decoder 32 has applied 0V to GWL2 and GWL3, but the WL_select_decoder 34 has provided +V (positive voltage) to WL_SEL0[7:0] and WL_SEL1[7:0], and 0V to WL_MID[7:0].

FIG. 13, which includes FIGS. 13A, 13B and 13C, illustrates an example for providing selection of LWL0[0] with de-selection of all other word lines being indicated by a negative voltage (−V). In the example of FIG. 13, essentially the same coding provided in the example of FIG. 7 is employed except that 0V is replaced with −V (negative voltage). As such, in order to provide selection of word line LWL0[0], the WL_select_decoder 34 is configured to provide WL_SEL0[0], WL_SEL1[7:0] and WL_MID[7,6,5,4,3,2,1] with values of HVG. The WL_select_decoder 34 may also provide WL_SEL0[7,6,5,4,3,2,1] and WL_MID[0] with −V (negative voltage). Meanwhile, the GWL decoder 32 may be configured to provide HVS to GWL0 and −V (negative voltage) to all other GWLs (e.g., GWL1 to GLW63). As a result, as shown in FIG. 13A, LWL0[0] is selected (as indicated by the word line value of HV), while all other word lines are deselected (as indicated by the word line value −V (negative voltage) of FIGS. 13A, 13B and 13C). In each of the examples above, Pwell may be connected to the lowest voltage.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A memory comprising a local word line driver for a memory array having a first word line and a second word line, the local word line driver comprising:
    a first selection transistor;
    a second selection transistor; and
    a middle selection transistor disposed between the first and second selection transistors,
    wherein the first word line couples to the first selection transistor and the middle selection transistor, and the second word line couples to the middle selection transistor and the second selection transistor; and
    wherein a first word line selection input is coupled to a gate of the first selection transistor, a second word line selection input is coupled to a gate of the second selection transistor, and a middle word line selection input is coupled to a gate of the middle selection transistor.

2. The memory of claim 1, wherein a second terminal of the first selection transistor is connected to a first terminal of the middle selection transistor, and a second terminal of the middle selection transistor is connected to a first terminal of the second selection transistor.

3. The memory of claim 2, wherein a first terminal of the first selection transistor and a second terminal of the second selection transistor are each coupled to a group word line decoder configured to select a group of local word line drivers based on providing a common selectable voltage to the first terminal of the first selection transistor or the second terminal of the second selection transistor of each local word line driver in the selected group.

4. The memory of claim 2, wherein the first word line is connected between the second terminal of the first selection transistor and the first terminal of the middle selection transistor and the second word line is connected between the second terminal of the middle selection transistor and the first terminal of the second selection transistor.

5. The apparatus of claim 1, wherein the memory is configured to provide a ratio of 1.5 transistors of the local word line driver for each word line.

6. The apparatus of claim 1, wherein the apparatus further comprises a group of local word line drivers that share common selectable voltage sources.

7. A memory comprising a group of local word line drivers for a memory array having a first word line and a second word line, each local word line driver of the group including:
    a first selection transistor;
    a second selection transistor; and
    a middle selection transistor disposed between the first selection transistor and the second selection transistor, wherein the first word line couples to the first selection transistor and the middle selection transistor, and the second word line couples to the middle selection transistor and the second selection transistor; and wherein a first word line selection input is coupled to a gate of the first selection transistor, a second word line selection input is coupled to a gate of the second selection transistor, and a middle word line selection input is coupled to a gate of the middle selection transistor.

8. The memory of claim 7, wherein a first terminal of the first selection transistor and a second terminal of the second selection transistor of each local word line driver in the group are each coupled to a group word line decoder configured to enable selection within one word line of the memory array based on providing a common selectable voltage to the first terminal of the first selection transistor or the second terminal of the second selection transistor of each local word line driver in the group selected.

9. The memory of claim 7, wherein the first word line is connected between a second terminal of the first selection transistor and a first terminal of the middle selection transistor and the second word line is connected between a second terminal of the middle selection transistor and a first terminal of the second selection transistor.

10. The memory of claim 7, wherein the apparatus is configured to provide a ratio of 1.5 transistors of each local word line driver for each word line.

11. A memory comprising:
a group word line decoder; and
a plurality of groups of local word line drivers for a memory array having a first word line and a second word line of a plurality of local word lines, each local word line driver of each group including:
a first selection transistor;
a second selection transistor; and
a middle selection transistor disposed between the first and second selection transistors,
wherein the group word line decoder is configured to provide selection of one of the groups,
wherein the first word line couples to the first selection transistor and the middle selection transistor, and the second word line couples to the middle selection transistor and the second selection transistor, and wherein a first word line selection input is coupled to a gate of the first selection transistor, a second word line selection input is coupled to a gate of the second selection transistor, and a middle word line selection input is coupled to a gate of the middle selection transistor.

12. The memory of claim 11, wherein a second terminal of the first selection transistor is connected to a first terminal of the middle selection transistor, and a second terminal of the middle selection transistor is connected to a first terminal of the second selection transistor.

13. The memory of claim 12, wherein a first terminal of the first selection transistor and a second terminal of the second selection transistor of each local word line driver in each group are each coupled to the group word line decoder configured to enable selection within one word line of the memory array based on providing a common selectable voltage to the first terminal of the first selection transistor or the second terminal of the second selection transistor of each local word line driver in the group selected.

14. The memory of claim 12, wherein the first word line is connected between the second terminal of the first selection transistor and the first terminal of the middle selection transistor and the second word line is connected between the second terminal of the middle selection transistor and the first terminal of the second selection transistor.

15. The memory of claim 11, further comprising a word line select decoder configured to provide coded input.

16. The memory of claim 15, wherein the word line select decoder is configured to provide the same coded input to each group and wherein the group word line decoder is configured to enable selection of one word line within the group selected based on the coded input.

17. The memory of claim 11, wherein the group word line decoder is configured to provide a negative voltage, a positive voltage or zero volts to the local word lines.

18. The memory of claim 11, wherein the memory is configured to provide a ratio of 1.5 transistors of each local word line driver in each group for each word line.

* * * * *